United States Patent
Lee

(10) Patent No.: US 8,574,662 B2
(45) Date of Patent: Nov. 5, 2013

(54) SUBSTRATE SECTION FOR FLEXIBLE DISPLAY DEVICE, METHOD OF MANUFACTURING SUBSTRATE SECTION, AND METHOD OF MANUFACTURING ORGANIC LIGHT EMITTING DISPLAY DEVICE INCLUDING SUBSTRATE

(75) Inventor: Dong-Beom Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 504 days.

(21) Appl. No.: 12/856,111

(22) Filed: Aug. 13, 2010

(65) Prior Publication Data

US 2011/0143079 A1   Jun. 16, 2011

(30) Foreign Application Priority Data

Dec. 15, 2009   (KR) .................. 10-2009-0125026

(51) Int. Cl.
- *B05D 5/06* (2006.01)
- *B29C 63/00* (2006.01)

(52) U.S. Cl.
USPC ............. 427/66; 156/701; 156/930; 438/29

(58) Field of Classification Search
USPC ............... 156/701, 930; 427/66; 438/29
See application file for complete search history.

(56) References Cited

U.S. PATENT DOCUMENTS

| 2001/0040645 A1* | 11/2001 | Yamazaki ............ 349/42 |
| 2002/0140347 A1* | 10/2002 | Weaver ............ 313/506 |
| 2007/0152213 A1 | 7/2007 | Weaver |
| 2008/0002118 A1 | 1/2008 | Paek et al. |
| 2009/0261062 A1 | 10/2009 | Kim |

FOREIGN PATENT DOCUMENTS

| JP | 2007-090803 | 4/2007 |
| KR | 10-2006-0050008 | 5/2006 |
| KR | 10-2007-0096278 | 10/2007 |
| KR | 1020080001744 | 1/2008 |
| KR | 1020090110097 | 10/2009 |

OTHER PUBLICATIONS

"The interfacial reaction between ITO and silicon nitride deposited by PECVD in fringe field switching device", Current Applied Physics, 2002 (pp. 229-232).
Korean Office Action dated May 16, 2011 in Korean Priority Application No. 10-2009-0125026.

* cited by examiner

*Primary Examiner* — James Lin
(74) *Attorney, Agent, or Firm* — Knobbe Martens Olson & Bear LLP

(57) ABSTRACT

A substrate section for a flexible display device is disclosed. The substrate section prevents adhesion loss between a reinforcing layer and a barrier layer, thereby preventing a peel-off phenomenon between an inorganic barrier layer and a reinforcing layer.

16 Claims, 3 Drawing Sheets

SUBSTRATE SECTION FOR FLEXIBLE DISPLAY DEVICE, METHOD OF MANUFACTURING SUBSTRATE SECTION, AND METHOD OF MANUFACTURING ORGANIC LIGHT EMITTING DISPLAY DEVICE INCLUDING SUBSTRATE

CROSS-REFERENCE TO RELATED APPLICATIONS

This application claims the benefit of Korean Patent Application No. 10-2009-0125026, filed on Dec. 15, 2009, in the Korean Intellectual Property Office, the disclosure of which is incorporated herein in its entirety by reference.

BACKGROUND

1. Field

The field relates to a substrate section for a flexible display device, a method of manufacturing the substrate section.

2. Description of the Related Technology

Flexible displays are produced on a thin substrate formed of plastic or the like, and are not damaged even when folded or rolled. Flexible displays are produced by using a liquid crystal display (LCD) or an organic light emitting display (OLED), wherein the LCD or OLED includes a thin film transistor (TFT).

Panels of flexible displays are formed by coating plastic on a support substrate, depositing a barrier on the plastic-coated support substrate, forming a backplane, and then performing a thin film encapsulation (TFE) process. In the flexible displays, a thick organic pixel defined layer is generally used and a thick passivation layer is generally formed during the TFE process for planarization by using an organic layer of the passivation layer. The plastic is then removed from the support substrate, and a protective film is attached to the top and bottom surfaces of the support substrate.

SUMMARY OF CERTAIN INVENTIVE ASPECTS

One aspect is a substrate section for a flexible display device, the substrate section including: a first substrate, a second substrate disposed above a center region of the first substrate, a reinforcing layer disposed between the first and second substrates, configured to reinforce adhesion between the first and second substrates, a first barrier layer configured to contact the reinforcing layer and to cover the second substrate, and a second barrier layer disposed above the first barrier layer, where the first barrier layer is less dense than the second barrier layer.

Another aspect is a method of manufacturing a substrate section for a flexible display device, the method including: preparing a first substrate configured to have at least one smooth surface, forming a reinforcing layer above the first substrate, forming a second substrate above the reinforcing layer, where the second substrate is configured to be flexible, forming a first barrier layer configured to cover a top surface of the second substrate, to surround side surfaces of the second substrate, and to contact the reinforcing layer, and forming a second barrier layer configured to be less dense than the first barrier layer.

Another aspect is a method of manufacturing an organic light emitting device, the method including: preparing a first substrate configured to have at least one smooth surface, forming a reinforcing layer above the first substrate, forming a second substrate above the reinforcing layer, where the second substrate is configured to be flexible, forming a first barrier layer configured to cover a top surface of the second substrate, surrounds side surfaces of the second substrate, and to contact the reinforcing layer, forming a second barrier layer above the first barrier layer, where the second barrier layer is configured to be more dense than the first barrier layer, forming an organic light emitter on the second barrier layer, forming an encapsulation layer for sealing the organic light emitter, and removing the first substrate and the reinforcing layer.

BRIEF DESCRIPTION OF THE DRAWINGS

The above and other features will become more apparent by describing in detail exemplary embodiments with reference to the attached drawings in which.

DETAILED DESCRIPTION OF CERTAIN INVENTIVE EMBODIMENTS

Figure 1:
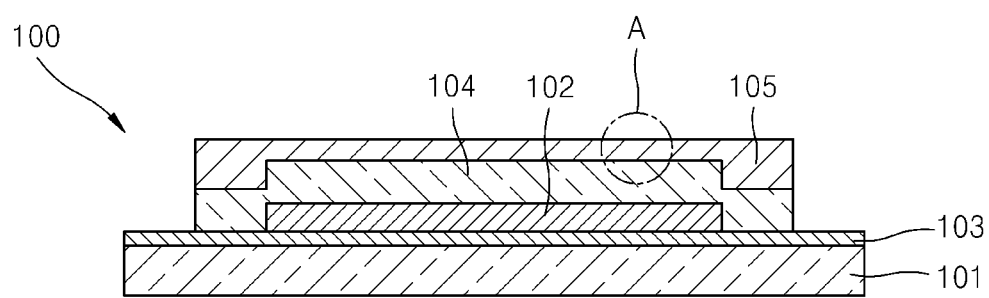
FIG. 1 shows a schematic cross-sectional view of a substrate section for a flexible flat panel display device, according to one embodiment of the present invention.

In the following detailed description, certain exemplary embodiments have been shown and described, simply by way of illustration. As those skilled in the art would realize, the described embodiments may be modified in various ways without departing from the spirit or scope of the present invention. Accordingly, the drawings and description are to be regarded as illustrative in nature and not restrictive. Like reference numerals generally designate like elements throughout the specification.

Figure 2:
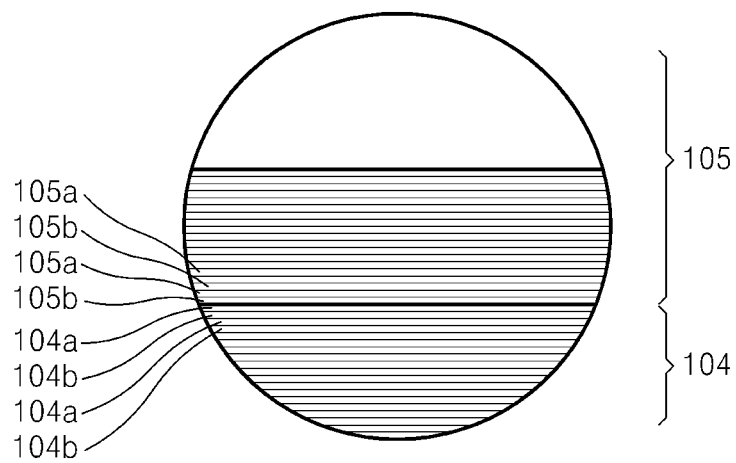
FIG. 2 shows a magnified view of a portion A of FIG. 1, according to one embodiment of the present invention.

FIG. 1 shows a schematic cross-sectional view of a substrate section for a flexible flat panel display device, according to one embodiment of the present invention. FIG. 2 shows a magnified view of a portion A of FIG. 1, according to one embodiment of the present invention. Referring to FIGS. 1 and 2, the substrate section 100 may include a first substrate 101, a reinforcing layer 103, a second substrate 102, a first barrier layer 104, and a second barrier layer 105.

The first substrate 101 may have at least one smooth surface. The reinforcing layer 103 and the second substrate 102 may be sequentially stacked above the smooth surface of the first substrate 101. The first substrate 101 may be formed of glass.

The reinforcing layer 103 is formed above the smooth surface of the first substrate 101, and disposed between the first and second substrates 101 and 102. The reinforcing layer 103 and the second substrate 102 are disposed only in a center region of the first substrate 101 and not in edge regions of the first substrate 101. The reinforcing layer 103 increases the adhesion between the first and second substrates 101 and 102.

The second substrate 102 is formed of a flexible synthetic resin, and if disposed directly on the first substrate 101 formed of a glass, it may get detached from the first substrate 101 due to poor adhesion characteristics between glass and synthetic resin. Accordingly, a reinforcing layer 103 is disposed between the first and second substrates 101 and 102 to increase the adhesion characteristic between the first and second substrates 101 and 102. Thus, the second substrate 102 may be prevented from being detached from the first substrate 101. The reinforcing layer 103 may be formed of an indium tin oxide (ITO), and formed above the first substrate 101 by using a sputtering process.

The first barrier layer 104 and the second barrier layer 105 may be sequentially formed above the second substrate 102. The first barrier layer 104 may contact the reinforcing layer 103 by covering a top surface of the second substrate 102 while surrounding side surfaces of the second substrate 102. The second barrier layer 105 may be formed above the first barrier layer 104. The first barrier layer 104 and the second barrier layer 105 may include a plurality of inorganic thin films. Referring to FIG. 2, the first barrier layer 104 may be formed by alternately stacking a first inorganic thin film 104a and a second inorganic thin film 104b. In addition, the second barrier layer 105 may be formed by alternately stacking a third inorganic thin film 105a and a fourth inorganic thin film 105b. The first inorganic thin film 104a and the second inorganic thin film 104b may be formed of silicon oxide ($SiO_x$) and silicon nitride ($SiN_x$), respectively, or vice versa. The third inorganic thin film 105a and the fourth inorganic thin film 105b may be formed of silicon oxide ($SiO_x$) and silicon nitride ($SiN_x$), respectively, or vice versa.

A portion of the first barrier layer 104 may be disposed above the second substrate 102 with the first barrier layer 104 covering the second substrate 102. The first barrier layer 104 is disposed between the second substrate 102 and the second barrier layer 105, and between the reinforcing layer 103 and the second barrier layer 105. The second barrier layer 105 may thus be prevented from directly contacting the reinforcing layer 103. The second barrier layer 105 is formed on the first barrier layer 104 so as not to directly contact the reinforcing layer 103.

By disposing the first barrier layer 104 between the reinforcing layer 103 and the second barrier layer 105, the second barrier layer 105 may be prevented from contacting the reinforcing layer 103, thereby preventing adhesion loss between the second barrier layer 105 and the reinforcing layer 103.

The first and second barrier layers 104 and 105 may be formed by using a plasma enhanced chemical vapor deposition (PECVD) process. The process for forming the first barrier layer 104 is referred to as a first PECVD process, and the process for forming the second barrier layer 105 is referred to as a second PECVD process. In both PECVD processes, silane ($SiH_4$) may be used as a precursor gas in order to form $SiO_x$ and $SiN_x$ thin films. When a $SiO_x$ or $SiN_x$ thin film is formed on the reinforcing layer 103, indium of ITO or zinc and hydrogen react with each other to generate precipitation on the reinforcing layer 103, and the precipitation reduces the adhesion between the $SiO_x$ or $SiN_x$ thin film and the reinforcing layer 103. As an amount of hydrogen is increased, more precipitation is generated, further reducing the adhesion.

According to one embodiment, since the hydrogen is generated from the $SiH_4$ gas, the first barrier layer 104 is formed with a smaller amount of $SiH_4$ gas than that used for forming the second barrier layer 105. The second barrier layer 105 is formed on the first barrier layer 104, thereby minimizing adhesion loss between the reinforcing layer 103 and the first and second barrier layers 104 and 105. Since the first barrier layer 104 is formed on the reinforcing layer 103 by using the first PECVD process using a smaller amount of $SiH_4$ gas than that used for forming the second barrier layer 105, less precipitation is generated than if the second barrier layer 105 were formed directly on the reinforcing layer 103. The reduced precipitation minimizes the adhesion loss. The amount of $SiH_4$ gas used in the first PECVD process may be about 50% lower than the amount used in the second PECVD process.

Since the first barrier layer 104 is formed with a smaller amount of $SiH_4$ gas than that used for forming the second barrier layer 105, the first barrier layer 104 is less dense than the second barrier layer 105.

The first barrier layer 104 and the second barrier layer 105 prevent impurities, such as oxygen, moisture, or the like, from penetrating into an organic light emitting unit 110 through the first and second substrates 101 and 102.

Figure 3:
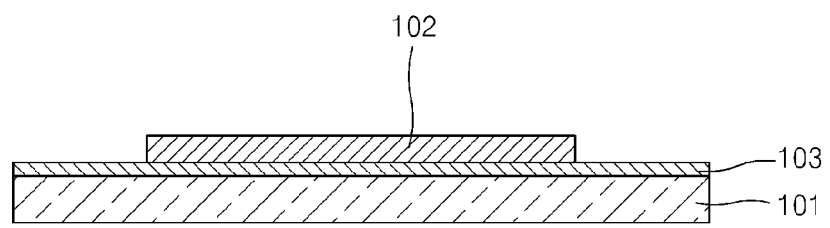
FIGS. 3 and 4 show schematic cross-sectional views of the substrate section of FIG. 1 during manufacturing, according to one embodiment.
Figure 4:
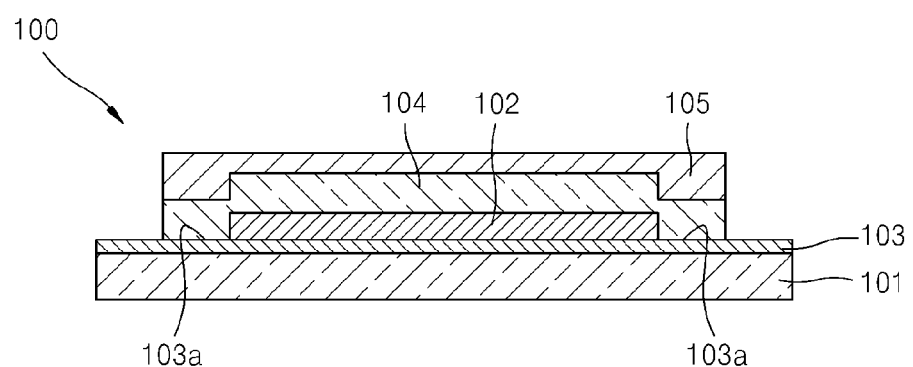

FIGS. 3 and 4 show schematic cross-sectional views of the substrate section of FIG. 1 during manufacturing, according to one embodiment.

FIG. 3 shows the first substrate 101 having at least one smooth surface being prepared, and the reinforcing layer 103 being formed on the smooth surface of the first substrate 101. The first substrate 101 may be formed of glass. The reinforcing layer 103 may be formed by depositing an ITO on the first substrate 101. The second substrate 102 is formed on the reinforcing layer 103. The second substrate 102 may be formed of a flexible synthetic resin. The second substrate 102 may be formed by using a spin coating method.

Next, referring to FIG. 4, the first barrier layer 104 and the second barrier layer 105 are sequentially formed above the second substrate 102. Portions of the first barrier layer 104 may contact the reinforcing layer 103 with the first barrier layer 104 covering the second substrate 102. The second barrier layer 105 is formed above the first barrier layer 104 and does not contact the reinforcing layer 103. The first barrier layer 104 and the second barrier layer 105 may be formed using a PECVD process. The first barrier layer 104 is formed using a first PECVD process with a an amount of SiH4. The second barrier layer 105 is formed using a second PECVD process, with a greater amount of SiH4 than that used in the first PECVD process. Due to the first barrier layer 104 being formed using a smaller amount of $SiH_4$, less precipitation is generated at a contact region between the first barrier layer 104 and the reinforcing layer 103, thereby minimizing adhesion loss between the first barrier layer 104 and the reinforcing layer 103.

Figure 5:
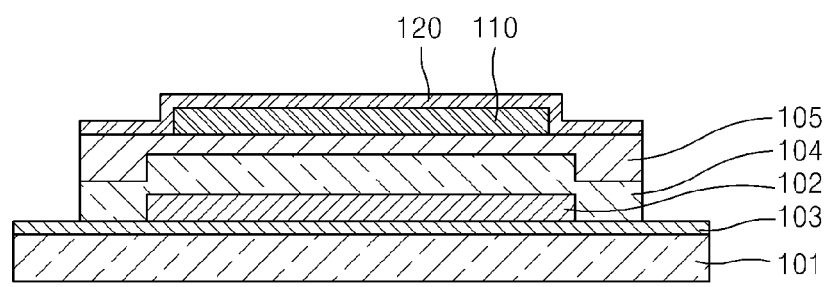
FIGS. 5 through 7 show cross-sectional views of an embodiment of manufacturing an organic light emitting display device by incorporating an embodiment of the substrate section of FIG. 1.
Figure 6:
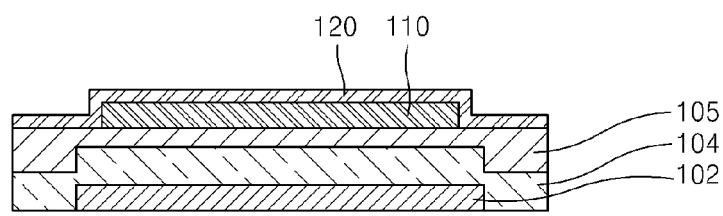
Figure 7:
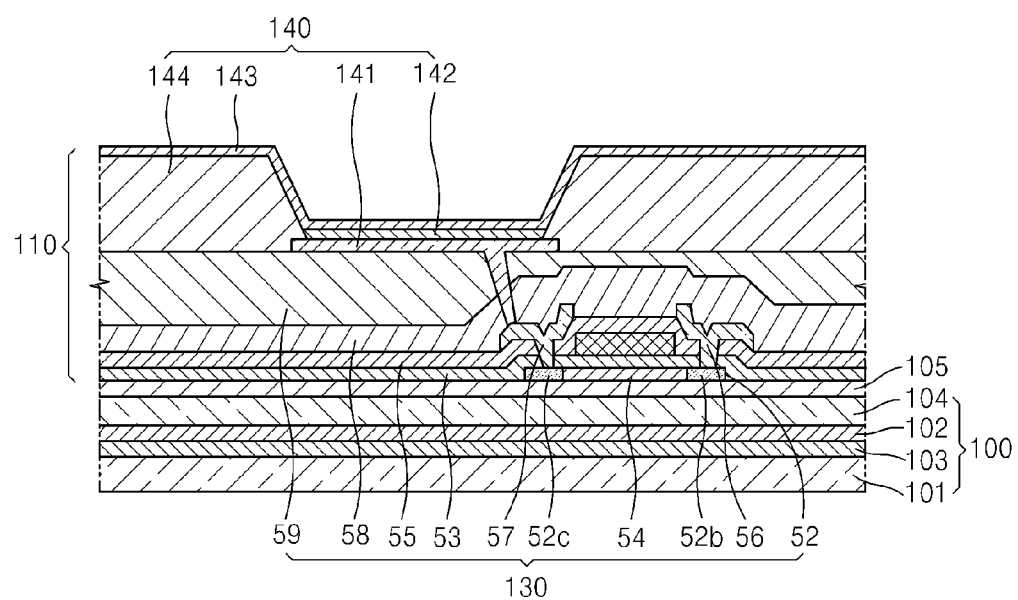

FIGS. 5 through 7 show cross-sectional views of an embodiment of manufacturing an organic light emitting display device by incorporating an embodiment of the substrate section of FIG. 1.

One embodiment of the substrate section 100 is prepared as described above, and as shown in FIG. 5, the organic light emitter 110 and an encapsulation layer 120 are formed above the first barrier layer 104.

One embodiment of the organic light emitter 110 may include a pixel circuit 130 and an organic light emitting device 140. The organic light emitter 110 is formed by sequentially forming the pixel circuit 130 and the organic light emitting device 140 above the first barrier layer 104. In one embodiment, the pixel circuit 130 may be a thin film transistor (TFT).

Referring to FIG. 7, an active layer 52 is formed above the first barrier layer 104 of the substrate section 100. A gate insulating layer 53 is formed above the active layer 52, and a gate electrode 54 is formed above a region of the gate insulating layer 53. The gate electrode 54 is connected to a gate line (not shown) that applies a TFT ON/OFF signal. An interlayer insulating layer 55 is formed above the gate electrode 54. Source/drain electrodes 56 and 57 are formed, each contacting source/drain regions 52b and 52c, respectively, of the active layer 52, through contact holes. An insulating layer 58 is formed above the source and drain electrodes 56 and 57.

The insulating layer 58 may be a passivation layer formed of $SiO_2$ or $SiN_x$. A planarization layer 59 is formed of an organic material such as acryl, polyimide, benzocyclobutene (BCB), and the like, above the insulating layer 58.

A pixel electrode 141 functions as an anode of the organic light emitting display device and is formed above the planarization layer 59. A pixel defining layer 144, formed of an organic material, covers the pixel electrode 141. An opening is formed in the pixel defining layer 144, and an intermediate layer 142 is formed above the pixel defining layer 144. The intermediate layer 142 is also formed above a portion of the pixel electrode 141 which is exposed through the opening of the pixel defining layer 144. The intermediate layer 142 includes an emissive layer. The structure of the organic light emitting display device is not limited to the embodiment above. Any of various structures of organic light emitting display devices may be used in other embodiments.

The organic light emitting element 140 displays image information by emitting red, green, and blue light according to a flow of current. The organic light emitting device 140 includes the pixel electrode 141, which is connected to the drain electrode 56 of the pixel circuit 130, and to which is applied a positive power voltage. The organic light emitting device 140 also includes a counter electrode 143, which is formed to cover the entire pixel defining layer 144 and the intermediate layer 142, and to which is applied a negative power voltage. The organic light emitting device 140 also includes the intermediate layer 142 which is disposed between the pixel electrode 141 and the counter electrode 143, and emits light.

The pixel electrode 141 and the counter electrode 143 are insulated from each other by the intermediate layer 142, and apply voltages of opposite polarities to the intermediate layer 142 so that the intermediate layer 142 may emit light.

The intermediate layer 142 may include a low molecular weight organic layer or a polymer organic layer. In embodiments where a low molecular weight organic layer is used, the intermediate layer 142 may have a single or multi-layer structure including at least one selected from the group consisting of a hole injection layer (HIL), a hole transport layer (HTL), an emission layer (EML), an electron transport layer (ETL), and an electron injection layer (EIL). Examples of organic materials for forming the intermediate layer 142 include copper phthalocyanine (CuPc), N,N'-di(naphthalene-1-yl)-N,N'-diphenyl-benzidine (NPB), and tris-8-hydroxyquinoline aluminum (Alq3). The low molecular weight organic layer may be formed using a vacuum deposition method.

In embodiments where a polymer organic layer is used, the intermediate layer 142 may have a structure including a HTL and an EML. In this case, the HTL may be formed of poly (ethylenedioxythiophene) (PEDOT), and the EML may be formed of polyphenylenevinylenes (PPVs) or polyfluorenes. The HTL and the EML may be formed by screen printing, inkjet printing, or the like.

The intermediate layer 142 is not limited to the organic layers described above, and may be embodied in various other ways.

The intermediate layer 142 may be formed by using a spin coating method. An organic material is coated on the pixel electrode 141 and the pixel defining layer 144 to cover the pixel electrode 141 and the pixel defining layer 144. The substrate section 100 is then spun. The organic material coated on the pixel defining layer 144 is removed and only the organic material coated on the pixel electrode 141 is left, due to the spinning of the substrate section 100. Next, the organic material coated on the pixel electrode 141 is sintered so as to form the intermediate layer 142.

In one embodiment, the pixel electrode 141 functions as an anode, and the counter electrode 143 functions as a cathode. In other embodiments, the pixel electrode 141 may function as a cathode, and the counter electrode 143 may function as an anode.

The pixel electrode 141 may be formed as a transparent electrode or a reflective electrode. A transparent electrode may be formed of indium tin oxide (ITO), indium zinc oxide (IZO), zinc oxide (ZnO), or indium oxide ($In_2O_3$). A reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and forming a layer of ITO, IZO, ZnO, or $In_2O_3$ above the reflective layer.

The counter electrode 143 may be formed as a transparent electrode or a reflective electrode. In embodiments where the counter electrode 143 is formed as a transparent electrode, the counter electrode 143 functions as a cathode. A transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, above the intermediate layer 142 and forming an auxiliary electrode layer or a bus electrode line thereon by using a transparent electrode forming material, such as ITO, IZO, ZnO, $In_2O_3$, or the like. In embodiments where the counter electrode 143 is formed as a reflective electrode, the reflective layer may be formed by depositing Li, Ca, LiF/Ca, LiF/Al, Al, Ag, Mg, or a compound thereof on the entire surface of the intermediate layer 142 and the pixel defining layer 144.

Once the organic light emitter 110 is formed, it is sealed by an encapsulation layer 120. In one embodiment, the encapsulation unit 120 may be formed by alternately stacking a thin organic layer and a thin inorganic layer. In other embodiments, the encapsulation layer 120 may be formed of a metal layer.

As shown in FIG. 6, a delamination process of separating the first and second substrates 101 and 102 is then performed. Laser beam irradiation, chemical dissolution, or the like is performed depending on the material used to form the reinforcing layer 103, so as to remove the reinforcing layer 103, thereby separating the first and second substrate 101 and 102 from each other.

According to embodiments of the present invention, reduction in an amount of indium is prevented in a reinforcing layer of ITO when a barrier layer is formed, and thus a adhesion loss between the barrier layer and the reinforcing layer may be minimized.

While this disclosure has been described with reference to certain exemplary embodiments, it will be understood by those of ordinary skill in the art that various changes in form and details may be made.

What is claimed is:

1. A method of manufacturing a substrate section for a flexible display device, the method comprising:
   preparing a first substrate configured to have at least one smooth surface;
   forming a reinforcing layer above the first substrate;
   forming a second substrate above the reinforcing layer, wherein the second substrate is configured to be flexible;
   forming a first barrier layer configured to cover a top surface of the second substrate, to surround side surfaces of the second substrate, and to contact the reinforcing layer, wherein the first barrier layer is formed using a first plasma enhanced chemical vapor deposition (PECVD) process; and forming a second barrier layer configured to be more dense than the first barrier layer, wherein the second barrier layer is formed using a second PECVD, and wherein an amount of silane (SiH4) gas used in the first PECVD process is less than an amount of SiH4 gas used in the second PECVD process.

2. The method of claim 1, wherein the first substrate is formed of glass.

3. The method of claim 1, wherein the reinforcing layer is configured to reinforce adhesion between the first and second substrates.

4. The method of claim 3, wherein the forming of the reinforcing layer comprises depositing indium tin oxide (ITO) on the first substrate.

5. The method of claim 1, wherein the second substrate is formed of a flexible synthetic resin.

6. The method of claim 1, wherein the amount of SiH4 gas used in the first PECVD process is less than about 50% of the amount of SiH4 gas used in the second PECVD process.

7. The method of claim 1, wherein each of the first barrier layer and the second barrier layer comprises a plurality of inorganic thin films.

8. The method of claim 7, wherein each of the first barrier layer and the second barrier layer is formed by alternately stacking a silicon oxide (SiOx) layer and a silicon nitride (SiNx) layer.

9. A method of manufacturing an organic light emitting device, the method comprising:

preparing a first substrate configured to have at least one smooth surface;

forming a reinforcing layer above the first substrate;

forming a second substrate above the reinforcing layer, wherein the second substrate is configured to be flexible;

forming a first barrier layer configured to cover a top surface of the second substrate, surrounds side surfaces of the second substrate, and to contact the reinforcing layer;

forming a second barrier layer above the first barrier layer, wherein the second barrier layer is configured to be more dense than the first barrier layer;

forming an organic light emitter on the second barrier layer;

forming an encapsulation layer for sealing the organic light emitter; and removing the first substrate and the reinforcing layer.

10. The method of claim 9, wherein the first substrate is formed of glass, and the second substrate is formed of a flexible synthetic resin.

11. The method of claim 9, wherein the forming of the reinforcing layer comprises depositing indium tin oxide (ITO) on the first substrate.

12. The method of claim 9, wherein the first barrier layer is formed using a first plasma enhanced chemical vapor deposition (PECVD) process, wherein the second barrier layer is formed using a second PECVD, and wherein an amount of silane (SiH4) gas used in the first PECVD process is less than an amount of SiH4 gas used in the second PECVD process.

13. The method of claim 12, wherein the amount of SiH4 gas used in the first PECVD process is less than about 50% of the SiH4 gas used in the second PECVD process.

14. The method of claim 12, wherein each of the first barrier layer and the second barrier layer comprises a plurality of inorganic thin films.

15. The method of claim 14, wherein each of the first barrier layer and the second barrier layer is formed by alternately stacking a silicon oxide (SiOx) layer and a silicon nitride (SiNx) layer.

16. A method of manufacturing a substrate section for a flexible display device, the method comprising:

preparing a first substrate configured to have at least one smooth surface;

forming a reinforcing layer above the first substrate;

forming a second substrate above the reinforcing layer, wherein the second substrate is configured to be flexible;

forming a first barrier layer configured to cover a top surface of the second substrate, to surround side surfaces of the second substrate, and to contact the reinforcing laye; and forming a second barrier layer configured to be less dense than the first barrier layer, wherein each of the first barrier layer and the second barrier layer is formed by alternately stacking a silicon oxide (SiOx) layer and a silicon nitride (SiNx) layer.

* * * * *

UNITED STATES PATENT AND TRADEMARK OFFICE
CERTIFICATE OF CORRECTION

PATENT NO.        : 8,574,662 B2                                  Page 1 of 1
APPLICATION NO.   : 12/856111
DATED             : November 5, 2013
INVENTOR(S)       : Dong-Beom Lee It is certified that error appears in the above-identified patent and that said Letters Patent is hereby corrected as shown below:

In the Specification

Column 4, line 33, delete "a an" and insert -- an --, therefor.

In the Claims

Column 8, line 36, Claim 16, delete "laye;" and insert -- layer; --, therefor.

Signed and Sealed this
Twenty-fourth Day of June, 2014

Michelle K. Lee
*Deputy Director of the United States Patent and Trademark Office*